US006975971B2

(12) United States Patent
Tang (10) Patent No.: US 6,975,971 B2
(45) Date of Patent: Dec. 13, 2005

(54) SYSTEM AND METHOD OF SECTION CUTTING AND ANALYSIS OF A COMPUTER MODEL

(75) Inventor: Dan X. Tang, Ann Arbor, MI (US)

(73) Assignee: Ford Global Technologies LLC, Dearborn, MI (US)

(*) Notice: Subject to any disclaimer, the term of this patent is extended or adjusted under 35 U.S.C. 154(b) by 879 days.

(21) Appl. No.: 09/804,869

(22) Filed: Mar. 13, 2001

(65) Prior Publication Data
US 2002/0133319 A1 Sep. 19, 2002

(51) Int. Cl.[7] ............................................. G06F 17/50
(52) U.S. Cl. .................. 703/1; 703/8; 700/30; 700/31; 345/420
(58) Field of Search ..................... 703/8, 7, 1; 345/418, 345/419, 435, 420; 700/28–31

(56) References Cited

U.S. PATENT DOCUMENTS

| 5,070,534 | A | | 12/1991 | Lascelles et al. |
| 5,111,413 | A | | 5/1992 | Lazsansky et al. |
| 5,197,120 | A | | 3/1993 | Saxton et al. |
| 5,808,616 | A | * | 9/1998 | Shimizu ..................... 345/419 |
| 6,113,643 | A | * | 9/2000 | Weber et al. .................. 703/8 |
| 6,446,697 | B1 | * | 9/2002 | Shaikh et al. ................ 164/4.1 |
| 6,487,525 | B1 | * | 11/2002 | Hall et al. ..................... 703/7 |
| 6,529,860 | B1 | * | 3/2003 | Strumolo et al. ............... 703/8 |
| 6,760,693 | B1 | * | 7/2004 | Singh et al. .................... 703/8 |

OTHER PUBLICATIONS

Lafon, "Solid Modeling With Constraints and Parameterised Features", IEEE, Jul. 1998.
Jinsong et al., "Parametric Design with Intelligence Configuration Analysis Mechanism", IEEE, Nov. 1993.
Mateos et al., "Parametric and Associative Design of Cartridges for Special Tools", IEEE 1995.

* cited by examiner

Primary Examiner—Russell Frejd
(74) Attorney, Agent, or Firm—Raymond L. Coppiellie; Bliss McGlynn P.C.

(57) ABSTRACT

A system and method of section cutting and analysis of a computer model is provided. The method includes the steps of selecting a computer generated model of a structural member and locating at least a first cutting plane and a last cutting plane on the model, such that the first and last cutting planes define a cutting path and cutting the model into at least one section along the cutting path. The method also includes the steps of maintaining the section in a memory of the computer system and analyzing the section using a computer aided engineering (CAE) analysis. The method further includes the steps of determining if the CAE analysis of the section meets a predetermined criteria, modifying the section if the section does not meet the predetermined criteria and using the section in the design of the model if the section meets the predetermined criteria.

15 Claims, 6 Drawing Sheets

SYSTEM AND METHOD OF SECTION CUTTING AND ANALYSIS OF A COMPUTER MODEL

BACKGROUND OF THE INVENTION

1. Field of the Invention

The present invention relates generally to computer-aided design and, more specifically, to a system and method of section cutting and analysis of a computer model.

2. Description of the Related Art

Vehicle design, and in particular automotive vehicle design, has advanced to a state in which computer-aided design techniques are frequently incorporated in the development of a new vehicle. Computer-aided design is especially beneficial in the design and analysis of a vehicle body to maximize design and functional capabilities of the vehicle. Advantageously, potential structural changes to the vehicle body can be considered in a timely and cost-effective manner using computer-assisted design techniques, versus preparing an actual vehicle model.

The structural design generated by the computer-aided design software program typically provides a user with a model in a format for computer aided engineering, manufacturing and other engineering evaluation purposes. Several software programs are generally known and commercially available for computer aided design and computer aided engineering purposes. However, the geometric complexity of a computer aided design model renders it time consuming to utilize for some engineering assessment purposes, especially for a system as complex as a vehicle. At the same time, potential modifications to the model are difficult to implement and assess, especially in a timely manner.

It is known to select a portion of the model to reduce the complexity of the engineering assessment. For example, a structural member, such as a beam, is cut from the CAD model and evaluated using computer aided engineering. However, this process is also time consuming and involves many manual operations, because of the geometric complexity. In addition, potential modifications to the structural member are also time consuming to analyze. Thus, there is a need in the art for a system and method of cutting a portion of a computer model into sections, and analyzing the sections using engineering analytical techniques.

SUMMARY OF THE INVENTION

Accordingly, the present invention is a system and method for section cutting and analysis of a computer model. The system includes a computer system having a memory, a processor, a user input device and a display device, with a computer generated model of a structural member stored in the memory of the computer system. The system also includes a user locating at least a first cutting plane and a last cutting plane on the model that defines a cutting path using the input device, and the model is cut into at least one section along the cutting path. The system also includes the computer system using a computer aided engineering (CAE) analysis to predict a property of the section and the user using the input device to modify the section if the property does not meet a predetermined criterion.

The method includes the steps of selecting a computer generated model of a structural member and locating at least a first cutting plane and a last cutting plane on the model, such that the first and last cutting planes define a cutting path and cutting the model into at least one section along the cutting path. The method also includes the steps of maintaining the section in a memory of the computer system and analyzing the section using a computer aided engineering (CAE) analysis. The method further includes the steps of determining if the CAE analysis of the section meets a predetermined criteria, modifying the section if the section does not meet the predetermined criteria and using the section in the design of the model if the section meets the predetermined criteria.

One advantage of the present invention is that a system and method of section cutting and analysis of a computer model is provided that cuts multiple sections from a portion of a structural design for computer aided engineering assessment purposes. Another advantage of the present invention is that a system and method is provided that reduces overall design time and related expenses. Yet another advantage of the present invention is that the system and method provides for engineering assessment of a structural model early in the design process, when complete design data may not yet be available. Still another advantage of the present invention is that the system and method provides for section generation, analysis and modification of the selected portion of the structural model for quick studies of various section design concepts. Yet still another advantage of the present invention is that the system and method supports computer-aided engineering analysis of the selected sections for engineering assessment purposes. A further advantage of the present invention is that the system and method enhances flexibility in design, while still meeting vehicle timing considerations.

Other features and advantages of the present invention will be readily appreciated, as the same becomes better understood, after reading the subsequent description taken in conjunction with the accompanying drawings.

BRIEF DESCRIPTION OF THE DRAWINGS

FIG. 7 is a perspective view of a beam element replacing a portion of the mesh of the FEA model, according to the present invention.

DESCRIPTION OF THE PREFERRED EMBODIMENT(S)

The design of a vehicle, and in particular the design of a vehicle structure, is achieved according to the present invention with a generic, parametric driven design method. Advantageously, this method allows flexibility in design of the vehicle structure, or a portion thereof and engineering analysis of the design in a fraction of the time required using conventional design methods. Various computer-based tools are integrated into a single user interface to achieve this enormous time and expense savings, including solid modeling, parametric design, automated studies and a knowledge-based engineering library.

Figure 1:
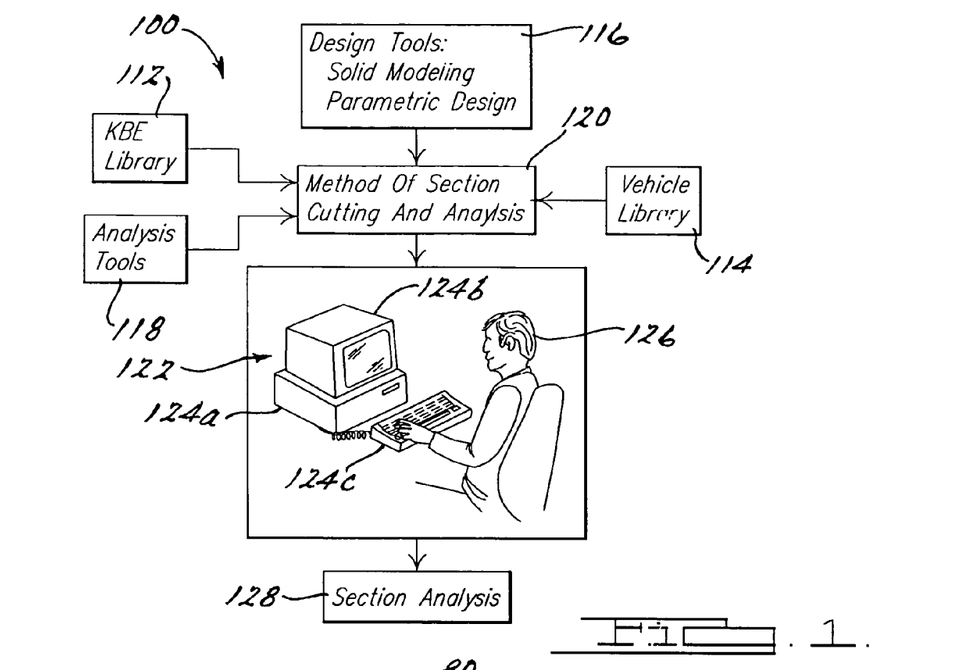
FIG. 1 is a diagramic view of a system which may be utilized in conjunction with a method of section cutting and analysis of a computer model, according to the present invention.

Referring to the drawings and in particular FIG. 1, one embodiment of a system 100 used by a method of section cutting and analysis of a computer model, according to the present invention, is illustrated graphically. The system 100 includes a knowledge-based engineering library 112 stored on an electronic storage device (not shown). The knowledge-based engineering library 112 includes design, engineering, and assembly rules for a vehicle structure. In this example, the knowledge-based engineering library 112 is a database of sub-libraries containing an electronic representation of various experts' knowledge of information relevant to the design of the vehicle structure. For example, the knowledge-based engineering library 112 includes a component parts library containing a database of various structural components available for use on the vehicle. The knowledge-based engineering library 112 may also provide interactive access to other web-based libraries.

The system 100 also includes a vehicle platform library 114 stored on the electronic storage device. The vehicle platform library 114 is an electrical representation of a vehicle structure or a portion thereof. For example, the vehicle platform library 114 may include a model of a particular vehicle body design, or a portion thereof such as a cowl or D-pillar. It should be appreciated that the vehicle platform library 114 may be a sub-library within the knowledge-based engineering library 112.

The system 100 may also include various design tools, shown generally at 116, which can be used for this design method 120, in a manner to be described. These design tools 116 may include solid modeling and parametric design techniques. Solid modeling, for example, takes electronically stored vehicle design data from the vehicle platform library 114 and builds a complex geometric system that can be used for computer aided engineering analysis. Several modeling programs are commercially available and generally known to those skilled in the art.

The parametric design technique is frequently used in the electronic construction of a geometrically defined vehicle component. It should be appreciated that the vehicle structure may be parametrically modeled. As a particular dimension or parameter is modified for a particular feature of the vehicle structure, a computer system 122 is instructed to regenerate a new geometric model. The knowledge-based engineering library 112 is used to control and limit the design process in accordance with predetermined design parameters.

The system 100 also includes various computer-aided engineering (CAE) analysis tools 118. One example of a CAE analysis tool 118 is a finite element analysis (FEA) software program, such as NASTRAN, SYSNOISE, or ABAQUS. Finite element analysis provides for stiffness and crash analysis of a section of the structure. The finite element analysis software program receives as an input a data file containing a mesh model of the section and predetermined conditions, as in known in the art. In this example, the output from the finite element analysis is available for stiffness assessment of the section and is generating axial and bending crush force deformation curves for the section.

The system 100 further includes a computer system 122 as is known in the art to implement a method of section cutting and analysis of a computer aided design model, according to the present invention. The computer system 122 includes a processor and a memory 124a, which can provide a display and animation of a section, such as the cowl, on a display device such as a video terminal 124b. Parametric selection and control for the design can be achieved by a user 126, via a user interactive device 124c, such as a keyboard or a mouse. The user 126 inputs a set of parameters and set of instructions into the computer system 122 when prompted to do so by the method 120. The set of parameters and the set of instructions may be product specific, wherein other data and instructions nonspecific to the product may already be stored in the computer system 122.

One example of an input method is a pop-up window with all current parameters, including an on-line description for the parameter and a current value therefore. For example, parametric values may be chosen from a table within a two-dimensional mode, since some vehicle designers prefer to view an assembly in sections which can be laid out on a drawing.

Once the computer system 122 receives the set of parameters and instructions from a user 126, the computer system 122 utilizes the method 120, discussed in detail subsequently, to predict stiffness, axial, and bending force-deformation curves for the structure. Advantageously, the computer implemented method of section cutting and analysis of a computer model, according to the present invention, combines all of the foregoing to provide an efficient, flexible, and rapid design. Further, a data file 128 containing the section analysis is an output of the method 120, and the data file 128 is available for further analysis and study.

Figure 2:
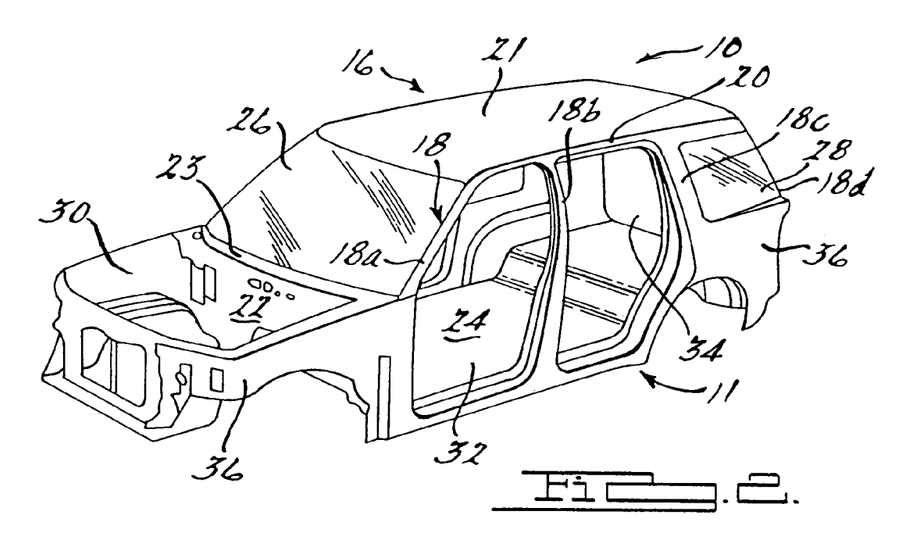
FIG. 2 is a perspective view of a computer design of a vehicle structure for use in conjunction with the system and method of section cutting and analysis of the computer model, according to the present invention.

Referring to FIG. 2, an example of a computer model for use in conjunction with the methodology (to be described) is illustrated. The model is representative of a vehicle 10, and in particular an automotive vehicle. The vehicle 10 is composed of integrated structural members 11 that form the structural base of the vehicle. For example, a frame (not shown) includes a pair of rails (not shown) disposed in a spaced relationship to one another and defining a longitudinal axis of the vehicle 10. A front axle (not shown) and rear axle (not shown) are disposed in a spaced relationship to one another and extending substantially transverse to the longitudinal axis of the vehicle 10. It should be appreciated that wheels (not shown), as are known in the art, are operatively mounted to the front axle and rear axle, for rolling engagement with a surface such as a road. It should also be appreciated that the distance between the front axle and rear axle is referred to in the art as the wheelbase, and the distance between the pair of front wheels or rear wheels is referred to as the track width.

The vehicle 10 also includes a vehicle body 16 which defines the shape of the vehicle 10, as is known in the art, and includes structural members 11 typically associated with the vehicle body 16. The vehicle body 16 is composed of structural members 11 joined together to form a load bearing structure for the vehicle 10. One example of a structural member 11 is a pillar 18. In this example, there are four pairs of vertically extending pillars 18 attached to the frame, which are referred to in the art as A, B, C, and D-pillars, 18a, 18b, 18c, 18d respectively. Another example of a structural member 11 is a pair of roof rails 20 that form the roof line of the vehicle 10. The roof rails 20 are disposed in spaced relationship to one another and extend therealong the longitudinal axis of the vehicle body 16. A generally planar roof panel 21 is supported between the roof rails 20. Another example of a structural member 11 is a dash panel 22, which forms a generally planar surface extending vertically between the A-pillars 18a. Still another example of a structural member 11 is a cowl 23, which forms a generally planar surface extending horizontally between the A-pillars 189. A further example of a structural member 11 is a floor 24 having a generally planar shape, as is known in the art. The vehicle body 16 includes a windshield 26, and other windows 28, as is known in the art.

The vehicle body 16 includes a front compartment 30, referred to as an engine compartment, which forms the general shape of the front of the vehicle 10. The vehicle body 16 further includes an occupant compartment 32 to accommodate vehicle occupants (not shown). It should be appreciated that the instrument panel 22, roof 21, floor 24 and pillar 18 cooperatively define the interior space of the vehicle 10 referred to as the occupant compartment 32. The occupant compartment 32 includes a number of seats (not shown) for the occupants and control mechanisms (not shown) to operate the vehicle 10. The vehicle body 16 also includes a rear compartment 34, referred to as a trunk compartment as is known in the art, forming the shape of the rear of the vehicle 10.

The vehicle body 16 includes a plurality of generally planar interconnected body panels 36 secured thereto using a conventional means such as welding or fastening. Advantageously, the body panels 36 further define an aesthetically pleasing shape of the vehicle 10.

Figure 3:
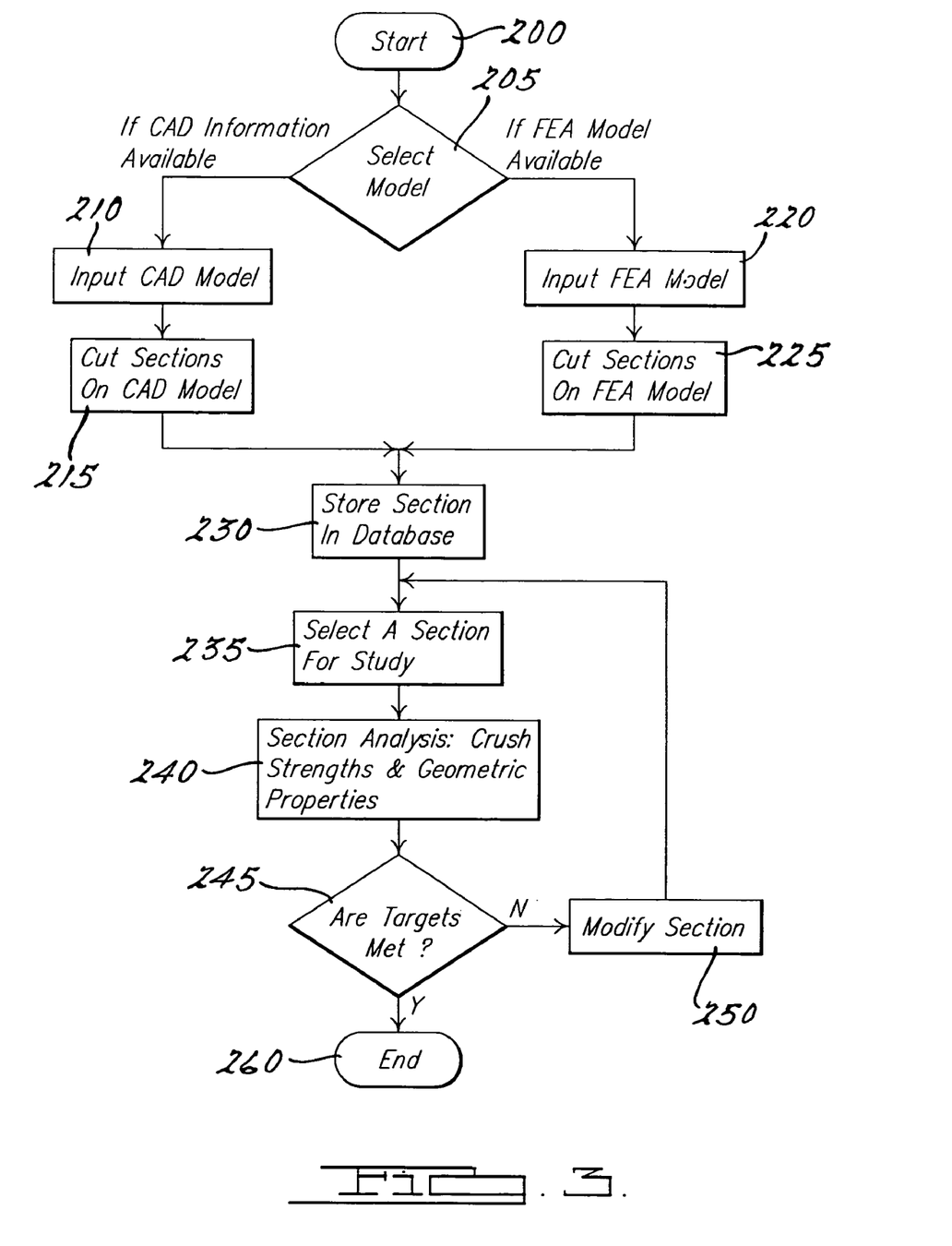
FIG. 3 is a flowchart of a method of section cutting and analysis of a computer model, according to the present invention, for the vehicle structure of FIG. 2.

Referring to FIG. 3, a flowchart of a method of section cutting and analysis of a computer model, according to the present invention, is illustrated. In this example, the computer model represents a vehicle 10, as previously described. It should be appreciated that the design process for a model, such as the vehicle 10, typically encompasses several overlapping phases, such as design initiation, development assessment and verification. Various design tools 116, as previously described, are utilized to carry out the design process. Advantageously, the methodology bridges the gap between computer-aided design and computer-aided engineering. The method begins in bubble 200 and advances to block 205.

In block 205, the user 126 selects a model of a structural member 11 for section cutting and analysis and determines a format of the model. In this example, the model of the structural member 11 is maintained in a computer-based library, such as the vehicle library 114, as previously described. Preferably, the structural member 11 represents a portion of the overall vehicle body 16 or frame. Examples of structural members 11 for the vehicle body 16 include the D-pillar 18d or cowl 23 as previously described. Frequently used model formats are CAD or FEA.

Figure 4:
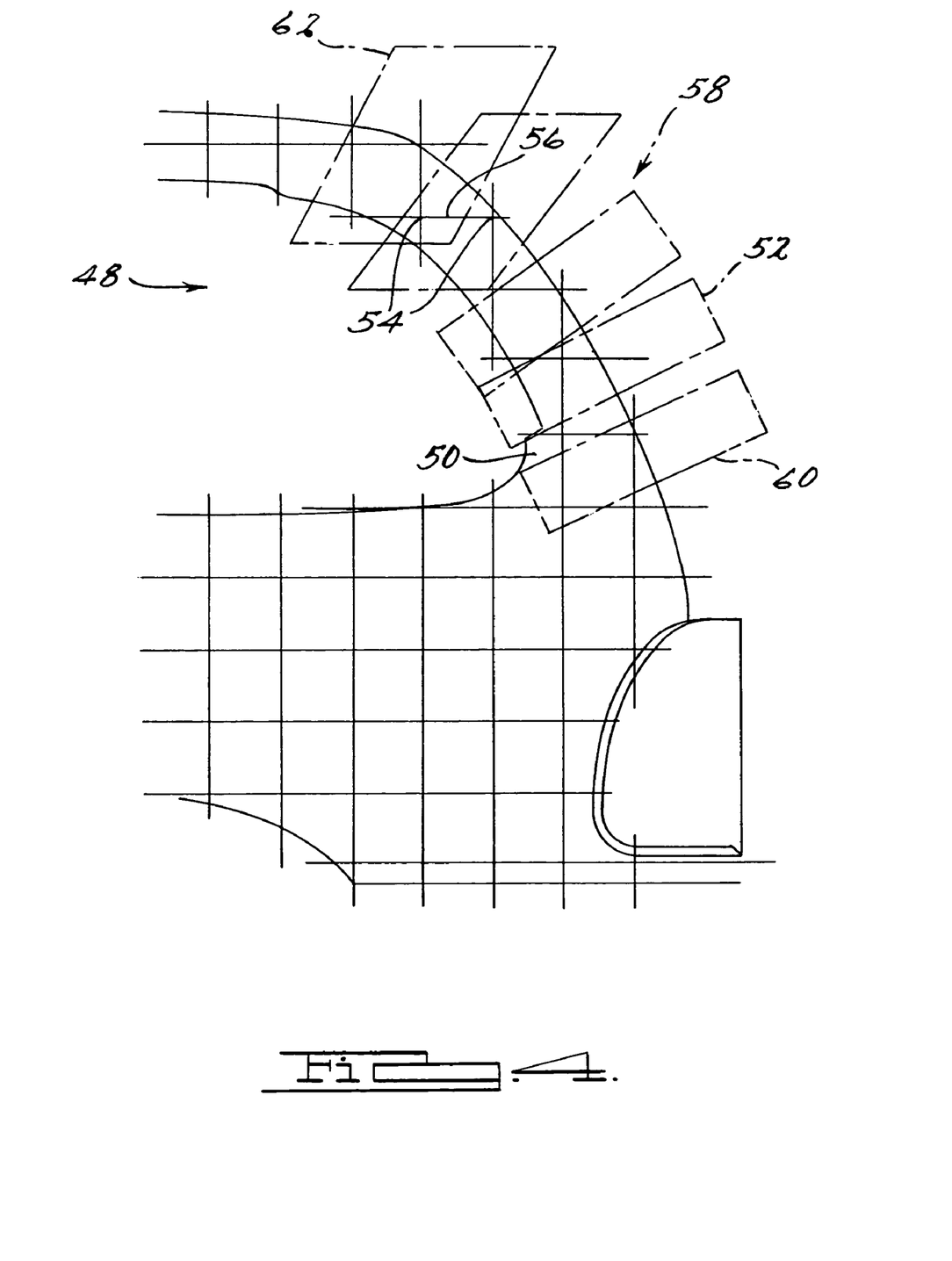
FIG. 4 is an elevational view of an example of a structural member representing a D-pillar for use by the method of FIG. 3, according to the present invention.

If a CAD model format is selected, the methodology advances to block 210. In block 210, the methodology imports the selected CAD model of the structural member 11 into the method for section cutting and analysis. Referring to FIG. 4, an example of a CAD model 48 representing the D-pillar 18d is illustrated. The methodology advances to block 215.

In block 215, the user 126 cuts the CAD model 48 of the structural member 11 into sections as shown at 50, by selecting a plurality of cutting planes. Preferably, the selected sections 50 are defined and cut from the structural member 11 using a technique referred to as plane and path guided cutting. For example, the user 126 initially defines an area of the CAD model 48 to cut into sections 50, such as by drawing a box (not shown) around the portion of the CAD model 48 that is to be cut using the mouse 124c. It should be appreciated that the drawing process includes a click, drag and release of the mouse 124c as is known in the art.

A pop-up window appears on the video terminal 124b prompting the user 126 to provide section parameters. An example of a section parameter is a number of sections 50. Another example of a section parameter is whether sections 50 are cut at equal intervals. For the CAD model 48, further example of a section parameter is a shell thickness or a material property. In this example, the cutting process for a CAD model 48 and an FEA model 68 are similar, except that the user 126 also specifies material properties and shell thickness for cutting the CAD model 48.

The user 126 locates a cutting plane, which defines the portion of the model to be cut. For example, the user 126 uses the mouse 124c to click on two nodes 54 on the model and a vertical plane 52 is generated. The orientation of the plane 52 is perpendicular to line 56 interconnecting the nodes 54. It should be appreciated that for the CAD model 48, a CAD line can be used to define a cutting plane. The plane is similarly oriented perpendicular to the plane. For example, the user 126 selects a line from the CAD model 48 that defines the section, using the mouse 124C. Similarly, if a section line exists for the CAD model 48, the planes can be generated by the user 126 "picking" the appropriate lines that define the section.

A cutting path 58 is defined by several planes 52 interposed between a first cutting plane, shown at 60 and a last cutting plane, shown at 62. It should be appreciated that the cutting planes 52 can be moved to center of geometry by using "pre-cut" sections at the plane locations. The center of geometry points for each section becomes the center point of the plane 52.

The methodology cuts the sections 50 along the cutting path 58 defined between the first cutting plane 60 and last cutting plane 62. The section shape is defined by a segment that represents the intersection of the cutting planes 52 and the model. It should be appreciated that the sections 50 may be cut automatically, that is, the user 126 specifies the cutting path and the number of sections and the methodology locates the planes and cuts the sections 50 accordingly. Alternatively, the user 126 may define each plane for each section 50. The methodology generates the sections 50 within the user defined area and using the user defined parameters. The methodology advances to block 230, to be described.

Figures 4, 5:
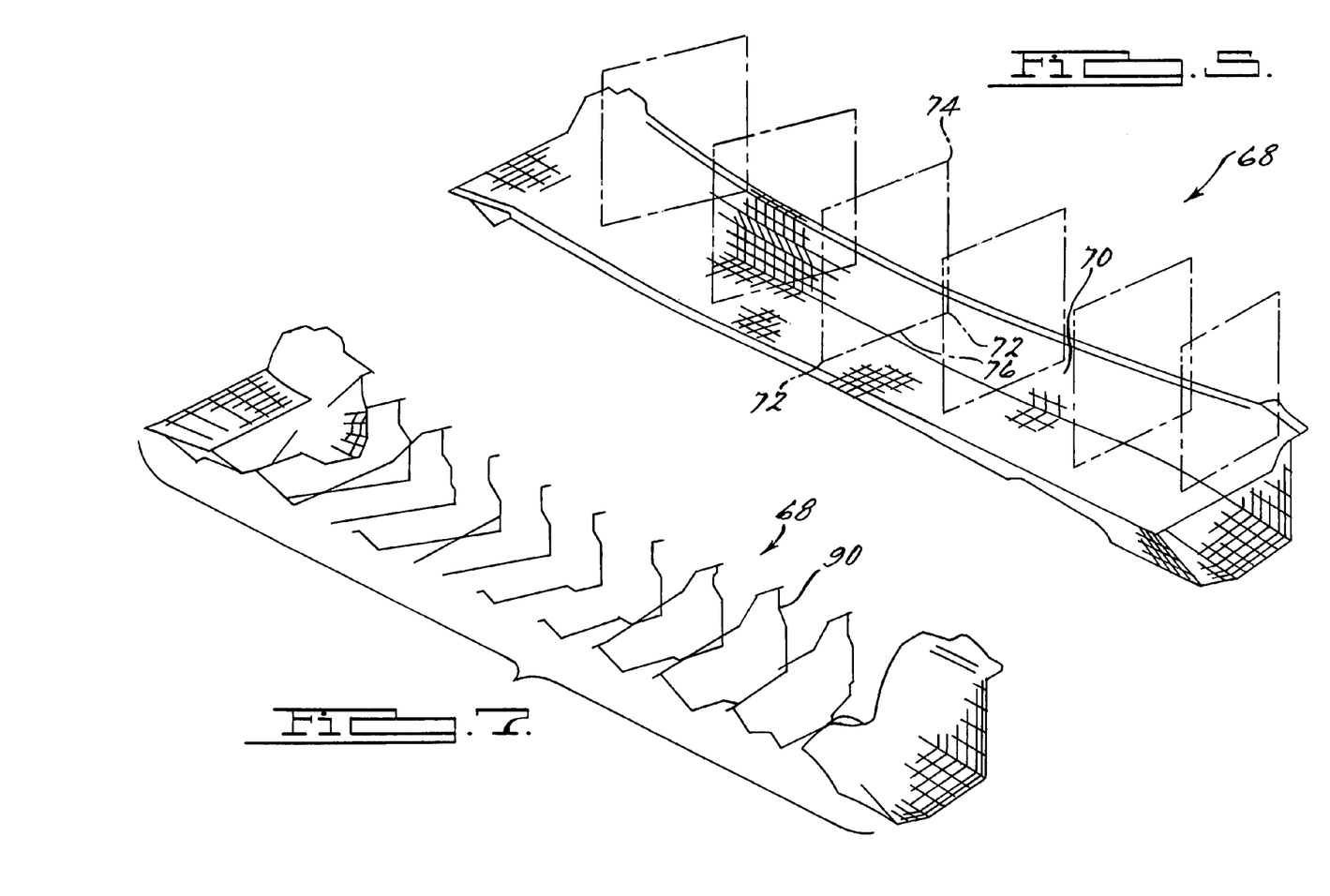
FIG. 5 is a perspective view of another example of a structural member representing a cowl top for use by the method of FIG. 3, according to the present invention.

Returning to diamond 205, if an FEA model 68 is selected, the methodology advances to block 220. In block 220, the methodology imports the selected FEA model 68 as an input to the methodology. Referring to FIG. 5, an example of an FEA model 68 of a cowl 23 is illustrated. The methodology advances to block 225.

In block 225, the user cuts the FEA structural model 68 into sections 70 in FIG. 5. It should be appreciated that the sections 70 are cut using the plane and path guided cutting technique previously described with respect to the CAD model 48. For example, the user 126 locates the section 70 by manipulating the mouse to select two nodes 72. The methodology creates a plane 74 perpendicular to a line 76 interconnecting the nodes 72. The methodology generates the sections 70 within the user defined area and using the user defined parameters. The methodology advances to block 230.

Figure 6:
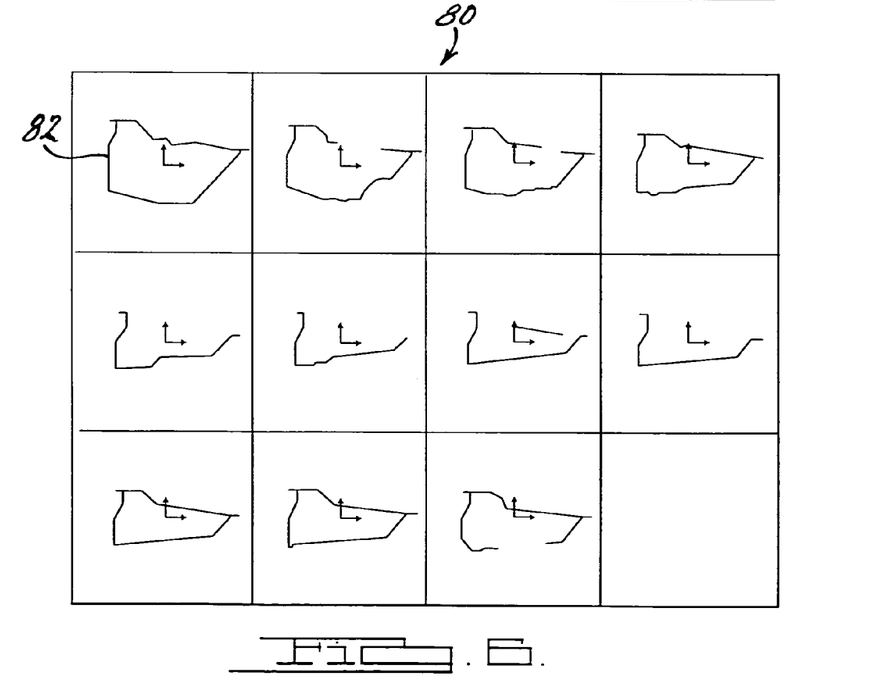
FIG. 6 is a diagrammatic view of the sections cut from the D-pillar of FIG. 4.

In block 230, the methodology stores the cut sections 50, 70 and information regarding the same in a database as shown in FIG. 6 at 80. Each section, shown at 82, represents a geometric shape based on the model, which in this figure is the FEA model 68. Preferably, information pertaining to the section 82, such as material property, is also stored in the database. Preferably, the database is an interactive database.

Advantageously, the FEA model 68 can be simplified by deleting all of the shell elements between the first and last cutting planes and replacing them with beam elements, as illustrated in FIG. 7 at 90. For example, a 3-node and 4-node element intersecting with the first and last cutting plane is cut into two or three 4-node and 3-node elements by the planes. The beam elements 90 use the sections at their ends to calculate their properties. The methodology advances to block 235.

In block 235, the user 126 selects a section 82 to study in greater detail from the sections 80 displayed on the display device representing the structural member 11. Preferably, the sections 80 are displayed in an organized manner, as illustrated in FIG. 6. The user 126 can manipulate the mouse 124C and select a section 82 by clicking on it, as is known in the art. The methodology advances to block 240.

Figure 8:
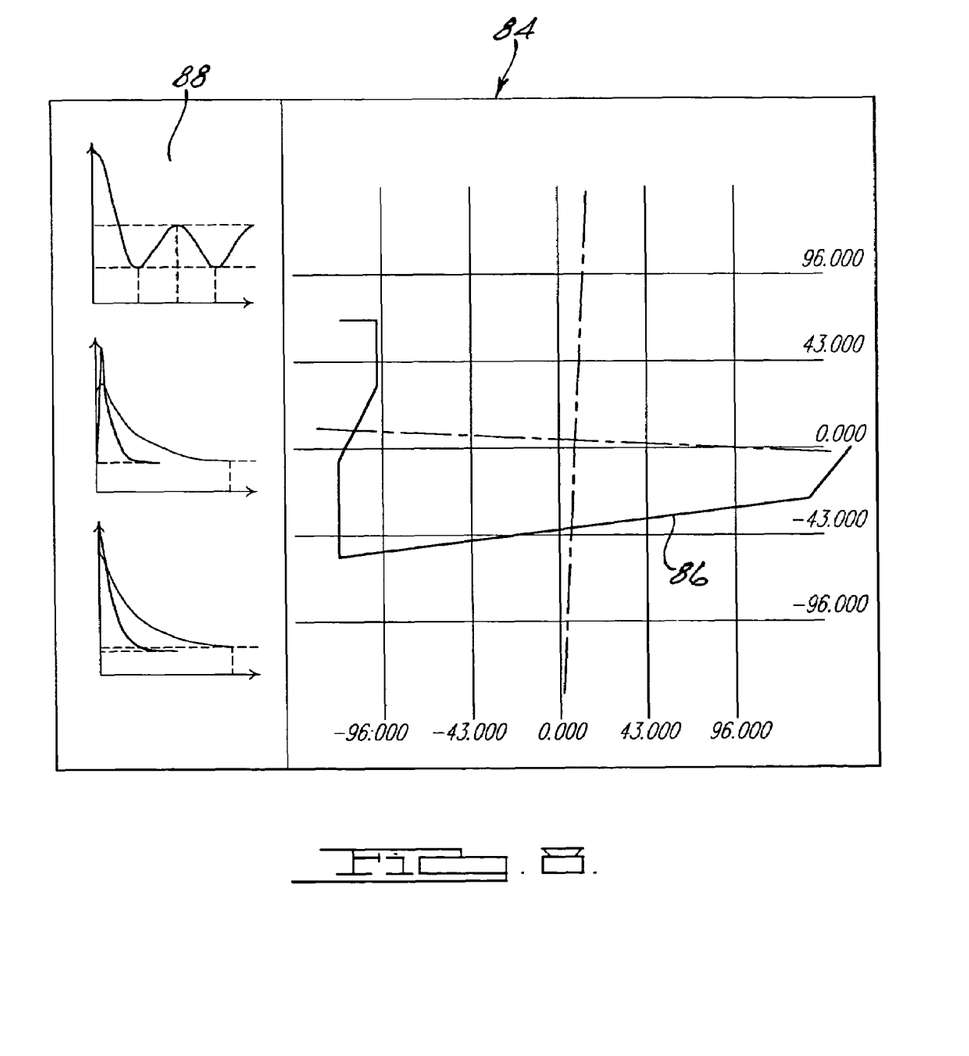
FIG. 8 is a diagrammatic view of the selected individual section of the model, according to the present invention.

In block 240, the methodology analyzes the selected section 82 using a CAE analytical tool 118. Preferably, the section analysis occurs automatically, and the result is presented in a pop-up window on the display screen, as illustrated in FIG.8 at 84. The shape of the selected section is shown at 86.

For example, the methodology can utilize FEA to calculate geometric and crush properties of a section 82 for stiffness assessment, as is known in the art. Geometric properties include area, moment of inertia, or torsional rigidity. Crush properties, as is known in the art, include crush strengths such as maximum axial crush force deformation, or maximum bending crush moment force deformation. It should be appreciated that a crush analysis predicts how much load a section 82 can carry. It should be appreciated that the crush properties may be displayed using a graphical format as shown in FIG. 8 at 88. The methodology advances to diamond 245.

In diamond 245, the user 126 determines whether the section analysis meets a predetermined target. An example of a predetermined target is a buckling strength defined as the load causing the section 82 to buckle. If the section analysis does not meet a predetermined target, the methodology advances to block 250.

In block 250, the user 126 modifies the section 82. For example, the user 126 may change the shape of the section 82 by modifying a coordinate of a node represented in a node table, or by moving a point on a segment to a new position using the mouse 124c. Alternatively, the user 126 may change a property such as the type of material used for the section 82, or the thickness of the section. Advantageously, the methodology can be an iterative process, whereby the analysis of the modified section is compared to the analysis of the original section. The methodology returns to diamond 235 and continues to analyze the section 82.

Returning to diamond 245, if the section analysis does meet a predetermined target, the methodology advances to block 255. In block 255, the user 126 uses the section analysis in the design of the structural member 11. Advantageously, the methodology can be used to rapidly analyze a CAD or FEA model and consider design variations without building a physical prototype. The methodology advances to bubble 260 and ends.

The present invention has been described in an illustrative manner. It is to be understood that the terminology, which has been used, is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A method of section cutting and analysis of a computer model, said method comprising the steps of:
   selecting a computer generated model of a structural member, wherein the computer generated model is stored in a memory of a computer system;
   establishing cutting planes and a cutting path by locating at least a first cutting plane and a last cutting plane on the computer generated model, wherein the first and last cutting planes define the cutting path;
   automatically generating at least one section by cutting the computer generated model into the at least one section along the cutting path;
   maintaining the section in a memory of the computer system;
   automatically analyzing the section using a computer aided engineering (CAE) analysis;
   determining if the CAE analysis of the section meets a predetermined criteria;
   modifying the section if the predetermined criteria is not met; and
   using the section in the design of the model if the predetermined criterion is met.

2. A method as set forth in claim 1 including the step of determining if the model is a computer aided design (CAD) model and prompting a user to input a shell thickness if the model is a CAD model.

3. A method as set forth in claim 1 including the step of determining if the model is a computer aided design (CAD) model and prompting a user to input a material type if the model is a CAD model.

4. A method as set forth in claim 1 including the step of defining an area of the model for locating the cutting path after said step of selecting a computer model.

5. A method as set forth in claim 1 including the step of prompting a user to input a number of sections to generate, prior to said step of locating the first and last cutting planes.

6. A method as set forth in claim 1, wherein said step of locating a cutting plane includes the step of selecting two points on the model and generating a vertical plane oriented perpendicular to a line between the points.

7. A method as set forth in claim 1 wherein said step of locating a cutting plane includes the step of selecting a line on a computer aided design (CAD) model defining the cutting plane.

8. A method as set forth in claim 1 including the step determining if the model is a finite element analysis (FEA) model and simplifying the FEA model by replacing a shell element along the cutting path with a beam element.

9. A method as set forth in claim 1 wherein said step of analyzing the section includes the step of using finite element analysis to determine a geometric property of the section to assess its stiffness.

10. A method as set forth in claim 1 wherein said step of analyzing the section includes the step of using finite element analysis to determine a crush strength of the section.

11. A method of section cutting and analysis of a computer model of a structural member, said method comprising the steps of:
   selecting a model of the structural member from a library of models stored in a memory of a computer system having a memory, a processor a user input device and a display device;

defining an area of the model for section cutting and analysis using the device;

establishing cutting planes by locating at least a first cutting plane and a last cutting plane on the model, wherein the cutting plane is located by selecting two points on the model and generating a vertical plane oriented perpendicular to a line between the points;

establishing a cutting path by defining a the cutting path between the first and last cutting planes;

automatically generating sections by cutting the model into a predetermined number of sections along the cutting path;

maintaining the cut sections in the memory of the computer system;

determining if the model is a finite element analysis (FEA) model and simplifying the FEA model by replacing a shell element along the cutting path with a beam element;

automatically analyzing the sections using a computer aided engineering (CAE) analysis to determine geometric properties and crush strength of the section;

determining if the CAE analysis of a selected section meets a predetermined criterion;

modifying the selected section if the predetermined criterion is not met; and using the selected section in the design of the model if the predetermined criterion is met.

12. A method as set forth in claim 11 including the step of determining if the model is a computer aided design (CAD) model and prompting a user to input a shell thickness if the model is a CAD model.

13. A method as set forth in claim 11 including the step of determining if the model is a computer aided design (CAD) model and prompting a user to input a material type if the model is a CAD model.

14. A method as set forth in claim 11 including the step of prompting a user to input a number of sections to cut along the cutting path.

15. A method as set forth in claim 11 wherein said step of locating a cutting plane includes the step of selecting a line on a computer aided design model defining the cutting plane.

* * * * *